United States Patent
Shibuya et al.

(10) Patent No.: US 11,009,789 B2
(45) Date of Patent: May 18, 2021

(54) PATTERN FORMATION METHOD AND METHOD FOR MANUFACTURING POLARIZING PLATE

(71) Applicant: Dexerials Corporation, Tokyo (JP)

(72) Inventors: Kazuyuki Shibuya, Tokyo (JP); Shigeshi Sakakibara, Tokyo (JP); Toshiaki Sugawara, Tokyo (JP); Yusuke Matsuno, Tokyo (JP); Akio Takada, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 16/961,563

(22) PCT Filed: Jan. 11, 2019

(86) PCT No.: PCT/JP2019/000661
§ 371 (c)(1),
(2) Date: Jul. 10, 2020

(87) PCT Pub. No.: WO2019/139116
PCT Pub. Date: Jul. 18, 2019

(65) Prior Publication Data
US 2021/0011374 A1    Jan. 14, 2021

(30) Foreign Application Priority Data
Jan. 12, 2018    (JP) .............................. JP2018-003235

(51) Int. Cl.
*G03F 7/00*    (2006.01)
*G03F 1/38*    (2012.01)
(Continued)

(52) U.S. Cl.
CPC ........... *G03F 7/001* (2013.01); *G02B 5/3033* (2013.01); *G03F 1/38* (2013.01)

(58) Field of Classification Search
CPC ......... G03F 7/001; G03F 1/38; G02B 5/3033; H01L 21/0332; H01L 21/0276;
(Continued)

(56) References Cited

U.S. PATENT DOCUMENTS 9,268,075 B1*   2/2016  Yoon ................... G02B 5/1809
2001/0028925 A1*  10/2001  Moshrefzadeh ..... G02B 5/3058
427/552
(Continued)

FOREIGN PATENT DOCUMENTS

JP    2008-149447 A    7/2008
JP    2013-073974 A    4/2013
(Continued)

OTHER PUBLICATIONS

Notice of Reasons for Rejection issued to JP Application No. 2018-003235, dated Apr. 3, 2018 (4 pages).
(Continued)

*Primary Examiner* — Martin J Angebranndt
(74) *Attorney, Agent, or Firm* — Osha Bergman Watanabe & Burton LLP

(57) ABSTRACT

Provided are a pattern formation method and a method for manufacturing a polarizing plate using the pattern formation method, the pattern formation method having: a step for forming, on a substrate, a linear guide pattern which is arranged at a predetermined pitch and is compatible with a portion of block chains of a block copolymer, and a neutral pattern embedded in the pattern of the guide pattern; a step for forming a layer including a block copolymer on the guide pattern and the neutral pattern; a step for heat-treating the layer including the block copolymer and forming a lamellar structure in which lamellar boundaries are arranged perpendicular to the substrate by microphase separation of the block copolymer; and a step for selectively removing a
(Continued)

portion of the block chains of the block copolymer and thereby forming a line-and-space-shaped fine pattern having a smaller pitch than the guide pattern.

8 Claims, 3 Drawing Sheets

(51) Int. Cl.
*G02B 5/30* (2006.01)
*H01L 21/027* (2006.01)
*H01L 21/033* (2006.01)
*H01L 21/308* (2006.01)
*H01L 21/311* (2006.01)

(58) Field of Classification Search
CPC ............ H01L 21/3086; H01L 21/0337; H01L 21/31144; H01L 21/31058; H01L 21/31133; H01L 21/02318; H01L 21/02118
See application file for complete search history.

(56) References Cited

U.S. PATENT DOCUMENTS

| | | | |
|---|---|---|---|
| 2008/0038467 | A1 | 2/2008 | Jagannathan et al. |
| 2012/0080404 | A1* | 4/2012 | Lee ..................... C08F 293/005 216/37 |
| 2013/0075360 | A1 | 3/2013 | Nakamura et al. |
| 2014/0063467 | A1 | 3/2014 | Takahashi et al. |
| 2015/0064917 | A1 | 3/2015 | Somervell et al. |
| 2016/0077435 | A1* | 3/2016 | Ban ........................ G03F 7/165 430/315 |
| 2016/0244581 | A1* | 8/2016 | Brink ..................... B05D 1/185 |
| 2016/0276167 | A1 | 9/2016 | Seino |
| 2016/0365280 | A1* | 12/2016 | Brink .................. H01L 23/5226 |
| 2017/0148641 | A1 | 5/2017 | Tobana et al. |
| 2017/0213744 | A1* | 7/2017 | Park .................. H01L 21/31058 |

FOREIGN PATENT DOCUMENTS

| | | |
|---|---|---|
| JP | 2014-026230 A | 2/2014 |
| JP | 2014-052439 A | 3/2014 |
| JP | 2014-164043 A | 9/2014 |
| JP | 2015-106639 A | 6/2015 |
| JP | 2015-159233 A | 9/2015 |
| JP | 2016-173415 A | 9/2016 |
| JP | 2016-532311 A | 10/2016 |

OTHER PUBLICATIONS

Notice of Reasons for Rejection issued to JP Application No. 2018-003235, dated Jul. 24, 2018 (3 pages).
A. Checco et al., "Robust Superhydrophobicity in Large-Area Nanostructured Surfaces Defined by Block-Copolymer Self Assembly", Advanced Materials, 2014. 02. 12, vol. 26, No. 6, p. 886-891 (6 pages).
International Search Report issued in International Application No. PCT/JP2019/000661, dated Apr. 2, 2019 (5 pages).
Written Opinion issued in International Application No. PCT/JP2019/000661; Dated Apr. 2, 2019 (4 pages).
Office Action in counterpart Chinese Patent Application No. 201980006861.1 dated Dec. 3, 2020 (11 pages).

* cited by examiner

PATTERN FORMATION METHOD AND METHOD FOR MANUFACTURING POLARIZING PLATE

TECHNICAL FIELD

The present invention relates to a pattern formation method and a method for manufacturing a polarizing plate.

BACKGROUND ART

A polarizing plate is an optical element that absorbs or reflects polarized light in one direction, and allows polarized light in a direction orthogonal to the one direction to be transmitted therethrough. In recent years, in an optical apparatus such as a liquid crystal projector for which heat-resistance is required, a wire grid type inorganic polarizing plate has been employed instead of an organic polarizing plate.

A wire grid type polarizing plate has a configuration in which a plurality of conductive wires extending in one direction are arranged in parallel on a transparent substrate at a pitch (cycle) shorter than a wavelength of light in a use band, and is manufactured by etching a metal film formed on the transparent substrate to form the wires extending in the one direction. Typically, a mask pattern when etching the metal film is formed by a photolithography method or a nanoimprint method. When light is incident to the polarizing plate, polarized light (TE wave (S wave)) having an electric field component parallel to the extension direction of the wires cannot be transmitted and polarized light (TM wave (P wave)) having an electric field component perpendicular to the extension direction of the wires is transmitted as is.

By the way, it is known that optical characteristics (for example, a transmittance) of the wire grid type polarizing plate depend on a pitch of the wires. To improve the optical characteristics of the polarizing plate, it is necessary to narrow the pitch of the wire, and it is predicted that a pitch of 100 nm or less will be required in the future. Therefore, it is also required to narrow the pitch of a mask pattern when etching the metal film in accordance with the pitch of the wires.

However, in a case where a photoresist pattern formed by the photolithography method is set as the mask pattern, a major alteration on a process such as shortening of a wavelength of a light source and employing of an immersion exposure method is necessary to narrow the pitch of the mask pattern. In addition, in a case where a pattern formed by the nanoimprint method is set as the mask pattern, in order to narrow the pitch of the mask pattern, it is necessary to manufacture a mold conforming to the pitch, and thus it is difficult to narrow the pitch.

From the background, in Patent Document 1, it is suggested to form the mask pattern by using a block copolymer capable of forming a lamellar structure by microphase separation when manufacturing the wire grid type polarizing plate.

In a method disclosed in Patent Document 1, first, grooves with a predetermined pitch are formed in a surface of a base body such as a polyethylene terephthalate (PET) sheet, and then a metal film is formed on the entire surface of the base body including the bottoms of the grooves. Next, a diblock copolymer composed of an A-polymer chain and a B-polymer chain is applied on the metal film, and a heat treatment is performed. Through the heat treatment, the diblock copolymer is aligned with the grooves in the base body surface set as a guide, and a lamellar structure is formed. Then, the A-polymer chain is removed to form a line-and-space-shaped mask pattern constituted by the B-polymer chain. In addition, the metal film is etched through the mask pattern to form wires, and the mask pattern is removed to obtain a wire grid type polarizing plate.

Patent Document 1: Japanese Unexamined Patent Application, Publication No. 2008-149447

DISCLOSURE OF THE INVENTION

Problems to be Solved by the Invention

However, in the method disclosed in Patent Document 1, the metal film is formed on the entirety of the base body surface including the bottoms of the grooves, and the metal film is etched to form the wires. Therefore, a step difference occurs in the height of the wires in correspondence with the depth of the grooves, and this leads to deterioration of optical characteristics.

In addition, in the polarizing plate obtained by the method disclosed in Patent Document 1 has poor heat resistance because the base body such as the PET sheet is used. To improve the heat resistance, it is considered that a glass substrate is used instead of the PET sheet, but it is necessary to etch the glass substrate a after forming a mask pattern on the glass substrate so as to form grooves in the glass substrate, and thus it cannot be said that the method is a simple method.

The invention has been made in consideration such circumstances, and an object thereof is to provide a new pattern formation method capable of being appropriately used when manufacturing a wire grid type polarizing plate, and a method for manufacturing a polarizing plate by using the pattern formation method.

Means for Solving the Problems (1) To accomplish the object, according to an aspect of the invention, there is provided a pattern formation method using a block copolymer capable of forming a lamellar structure by microphase separation. The pattern formation method includes: a step of forming a linear guide pattern (for example, an antireflection layer pattern 21 to be described later) that is compatible with a part of block chains of the block copolymer and is arranged at a predetermined pitch, and a neutral pattern (for example, a neutral pattern 41 to be described later) embedded between a plurality of the guide patterns on a base material (for example, a base material 10 to be described later); a step of forming a layer (for example, a layer 50 including a block copolymer to be described later) including the block copolymer on the guide pattern and the neutral pattern; a step of heat-treating the layer including the block copolymer and forming the lamellar structure (for example, a first phase 51 and a second phase 52 to be described later) in which a lamellar boundary is arranged perpendicular to the base material by microphase separation of the block copolymer; and a step of forming a line-and-space-shaped fine pattern (for example, a fine pattern constituted by the first phase 51 to be described later) having a smaller pitch than the guide pattern by selectively removing a part of the block chains of the block copolymer.

(2) In the pattern formation method according to (1), the step of forming the guide pattern and the neutral pattern on the base material may include a step of laminating an antireflection layer (for example, an antireflection layer 20 to be described later) and a photoresist layer (for example, a photoresist layer 30 to be described later) on the base material in this order, a step of exposing and developing the photoresist layer and forming a line-and-space-shaped photoresist pattern (for example, a photoresist pattern 31 to be described later), a step of etching the antireflection layer by using the photoresist pattern as a mask and forming a line-and-space-shaped antireflection layer pattern (for example, an antireflection layer pattern 21 to be described later), a step of covering the photoresist pattern and the antireflection layer pattern with a neutral layer (for example, a neutral layer 40 to be described later), and a step of removing the photoresist pattern in combination with a part of the neutral layer, and the antireflection layer pattern may be set as the guide pattern, and a pattern constituted by the remainder of the neutral layer may be set as the neutral pattern.

(3) In the pattern formation method according to (2), exposure of the photoresist layer may be performed by interference exposure.

(4) In the pattern formation method according to any one of (1) to (3), a film thickness of the guide pattern may be greater than a film thickness of the neutral pattern.

(5) In the pattern formation method according to any one of (1) to (4), the block copolymer may be composed of polystyrene chains and polymethyl methacrylate chains.

(6) In the pattern formation method according to (5), in the step of forming the fine pattern, a fine pattern constituted by the polystyrene chains may be formed by selectively removing the polymethyl methacrylate chains of the block copolymer.

(7) The pattern formation method according to (5) may further include a step of making the polymethyl methacrylate chains of the block copolymer into a metal oxide after the heat treatment of the layer including the block copolymer, and in the step of forming the fine pattern, a fine pattern constituted by a metal oxide is formed by selectively removing the polystyrene chains of the block copolymer.

(8) According to another aspect of the invention, there is provided a method for manufacturing a polarizing plate (for example, a polarizing plate 1 to be described later). The method includes a step of forming a fine pattern (for example, a fine pattern constituted by a first phase 51 to be described later) by the pattern formation method according to any one of (1) to (7) on a base material (for example, a base material 10 to be described later) in which a metal film (for example, a metal film 12 to be described later) or a laminated film including a metal film is formed on a transparent substrate (for example, a transparent substrate 11 to be described later); and a step of etching the metal film or the laminated film by using the fine pattern as a mask.

Effects of the Invention

According to the invention, it is possible to provide a new pattern formation method capable of being appropriately used when manufacturing a wire grid type polarizing plate, and a method for manufacturing a polarizing plate by using the pattern formation method.

PREFERRED MODE FOR CARRYING OUT THE INVENTION

Hereinafter, an embodiment of the invention will be described with reference to the accompanying drawings.
[Pattern Formation Method]
A pattern formation method according to this embodiment is a pattern formation method using a block copolymer capable of forming a lamellar structure by microphase separation, and includes a step of forming a linear guide pattern that is compatible with a part of block chains of the block copolymer and is arranged at a predetermined pitch, and a neutral pattern that is embedded between a plurality of the guide patterns on a base material, a step of forming a layer including the block copolymer on the guide pattern and the neutral pattern, a step of heat-treating the layer including the block copolymer and forming the lamellar structure in which a lamellar boundary is arranged perpendicular to the base material by microphase separation of the block copolymer, and a step of forming a line-and-space-shaped fine pattern having a smaller pitch than the guide pattern by selectively removing a part of the block chains of the block copolymer.

Particularly, in the pattern formation method according to this embodiment, the step of forming the guide pattern and the neutral pattern on the base material includes a step of laminating an antireflection layer and a photoresist layer on the base material in this order, a step of exposing and developing the photoresist layer and forming a line-and-space-shaped photoresist pattern, a step of etching the antireflection layer by using the photoresist pattern as a mask and forming a line-and-space-shaped antireflection layer pattern, a step of covering the photoresist pattern and the antireflection layer pattern with a neutral layer, and a step of removing the photoresist pattern in combination with a part of the neutral layer. The antireflection layer pattern is set as the guide pattern, and a pattern constituted by the remainder of the neutral layer is set as the neutral pattern.

FIGS. 1A to 1I illustrate a method for forming a fine pattern on a base material for manufacturing a polarizing plate in a step order as an example of a pattern formation method according to this embodiment.

Figure 1A:
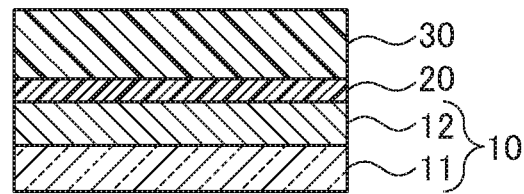
FIG. 1A is a view describing a step of a pattern formation method according to an embodiment.

First, as illustrated in FIG. 1A, an antireflection layer 20 and a photoresist layer 30 are laminated in this order on a base material 10. The base material 10 is obtained by forming a metal film 12 on a transparent substrate 11.

The transparent substrate 11 is not particularly limited as long as the substrate exhibits a light transmitting property with respect to light in a use band of the polarizing plate, and can be appropriately selected in correspondence with the purpose. "Exhibiting a light transmitting property with respect to light in a use band" does not mean that a transmittance of light in a use band is 100%, and a light transmitting property capable of retaining a function as the polarizing plate may be exhibited. Note that, examples of light in a use band include visible light of a wavelength of approximately 380 nm to 810 nm.

As a constituent material of the transparent substrate 11, a material having a refractive index of 1.1 to 2.2 is preferable, and glass, quartz, sapphire, and the like are exemplified. As the constituent material of the transparent substrate 11, glass is more preferable from the viewpoints of a cost and a transmittance.

A constituent material of the metal film 12 is not particularly limited as long as the constituent material is a material having a reflecting property with respect to light of a use band, and examples thereof include element simple substances such as Al, Ag, Cu, Mo, Cr, Ti, Ni, W, Fe, Ge, and Te, and alloys including one or kinds of elements among the element simple substances. Among these, it is preferable that the metal film 12 is formed from Al or an Al alloy.

For example, a film thickness of the metal film 12 is preferably 100 nm to 300 nm. Note that, the film thickness of the metal film 12 can be measured through observation with a scanning electron microscope or a transmission electron microscope. For example, the film thickness is measured with respect to arbitrarily selected four sites by using the scanning electron microscope or the transmission electron microscope, and an arithmetic average value of the film thicknesses can be set as the film thickness of the metal film 12. Hereinafter, the measurement method is referred to as an electron microscope method.

The antireflection layer 20 is a so-called lower antireflection layer (bottom anti-reflective coating; BARC), and is provided in a lower layer of the photoresist layer 30. In the pattern formation method according to this embodiment, an antireflection layer pattern obtained by patterning the antireflection layer 20 is used as a guide pattern for aligning a block copolymer, and thus as the antireflection layer 20, a material compatible with a part of block chain of the block copolymer is used.

The antireflection layer 20 may be an organic antireflection layer or an inorganic antireflection layer. For example, the organic antireflection layer can be formed by applying an antireflection film forming composition obtained by dissolving a resin component and the like in an organic solvent on the metal film 12 and by drying the composition. For example, the inorganic antireflection layer can be formed by coating an inorganic antireflection layer forming composition such as a silicon material on the metal film 12, and by baking the composition.

The photoresist layer 30 is provided in an upper layer of the antireflection layer 20. For example, the photoresist layer 30 can be formed by applying a photoresist composition on the antireflection layer 20 and by drying the composition. The photoresist composition is not particularly limited, and may be a positive type or a negative type.

Figure 1B:
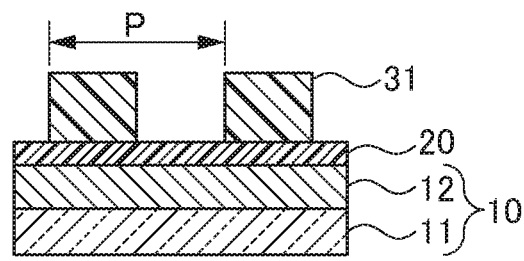
FIG. 1B is a view describing a step of the pattern formation method according to this embodiment.

Next, as illustrated in FIG. 1B, the photoresist layer 30 is exposed and developed to form a line-and-space-shaped photoresist pattern 31.

For example, a pitch P of the photoresist pattern 31 is preferably 100 nm to 200 nm. In addition, the pitch P is preferably integral times of a pitch in a final fine pattern in order for the block copolymer to be aligned. The pitch P can be measured by the above-described electron microscope method.

An exposure method of the photoresist layer 30 is not particularly limited, and may be a method through a photomask or a method without through the photomask. Among these, an interference exposure method is preferable from the viewpoint of suitability for relatively large area pattern formation.

In the interference exposure method, the photoresist layer 30 is exposed by using interference fringes formed by two light beams. The pitch P of the photoresist pattern 31 that is obtained can be adjusted by a wavelength and an interference angle of a light source. For example, when using a laser of a wavelength of 400 nm or less as the light source, the pitch P can be set to 200 nm or less. Examples of the laser of the wavelength of 400 nm or less include an HeCd laser (oscillation wavelength: 325 nm), an Nd solid laser (oscillation wavelength: 266 nm), and the like.

A development method of the photoresist layer 30 is not particularly limited, and a known developing solution such as an alkali developing solution can be used. Note that, a rinse treatment with water or the like may be performed after development.

Figure 1C:
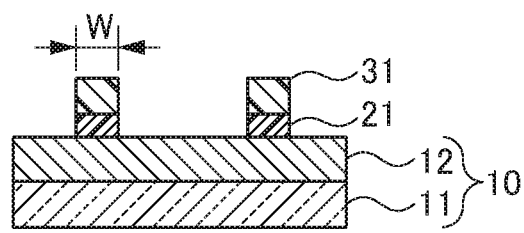
FIG. 1C is a view describing a step of the pattern formation method according to this embodiment.

Next, as illustrated in FIG. 1C, the antireflection layer 20 is etched by using the photoresist pattern 31 as a mask to form a line-and-space-shaped antireflection layer pattern 21. At this time, as illustrated in FIG. 1C, it is preferable to adjust a width of the photoresist pattern 31 and the antireflection layer pattern 21 by ashing or the like.

The width W of the photoresist pattern 31 and the antireflection layer pattern 21 is appropriately set in correspondence with a pitch in a final fine pattern. For example, to obtain a fine pattern having a pitch of approximately 150 nm, it is preferable to adjust the width W of the photoresist pattern 31 and the antireflection layer pattern 21 to approximately 25 nm to 75 nm. The width W can be measured by the above-described electron microscope method.

An etching method of the antireflection layer 20 is not particularly limited, and can be appropriately selected in correspondence with the constituent material of the antireflection layer 20. Note that, a rinse treatment with water or the like may be performed after etching.

Figure 1D:
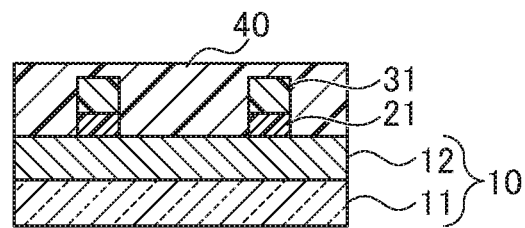
FIG. 1D is a view describing a step of the pattern formation method according to this embodiment.

Next, as illustrated in FIG. 1D, a neutral layer 40 that covers the photoresist pattern 31 and the antireflection layer pattern 21 is formed.

As a constituent material of the neutral layer 40, a material compatible with respective block chains of the block copolymer can be used. For example, in the case of using a material (PS-b-PMMA) composed of polystyrene (PS) chains and polymethyl methacrylate (PMMA) chains as the block copolymer, as a constituent material of the neutral layer 40, a random copolymer (PS-r-PMMA) composed of polystyrene and polymethyl methacrylate can be used.

A formation method of the neutral layer 40 is not particularly limited. For example, a composition obtained by dissolving a constituent material of the neutral layer 40 in an organic solvent is applied on the photoresist pattern 31 and the antireflection layer pattern 21 and is dried to form the neutral layer 40.

Note that, in a case where the constituent material of the neutral layer includes a hydroxy group, a silica layer (not illustrated) may be formed between the metal film 12 and the antireflection layer 20 in advance. When the silica layer is formed, the neutral layer 40 can be brought into close contact with the silica layer. In addition, the silica layer exhibits neutral properties with respect to the block copolymer as in the neutral layer, and thus the silica layer functions as a stopper layer when etching the antireflection layer 20.

Figure 1E:
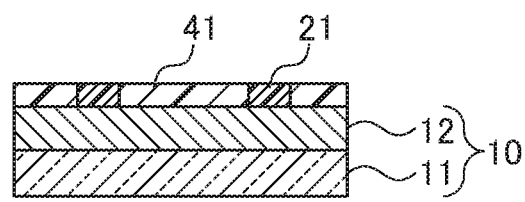
FIG. 1E is a view describing a step of the pattern formation method according to this embodiment.

Next, as illustrated in FIG. 1E, the photoresist pattern 31 is removed in combination with a part of the neutral layer 40.

As a result of removal of the photoresist pattern 31 and a part of the neutral layer 40, the antireflection layer pattern 21 as the guide pattern, and a neutral pattern 41 that is constituted by the remainder of the neutral layer 40 exist on the metal film 12. At this time, it is preferable that a film thickness of the antireflection layer pattern 21 is larger than a film thickness of the neutral pattern 41. When the film thickness of the antireflection layer pattern 21 is larger than the film thickness of the neutral pattern 41, the block copolymer tends to be easily aligned.

A method for removing the photoresist pattern 31 and a part of the neutral layer 40 is not particularly limited. For example, the photoresist pattern 31 and a part of the neutral layer 40 can be removed by immersing the photoresist pattern 31 and the neutral layer 40 in a known resist stripping solution. At this time, irradiation with ultrasonic waves may be performed to make the removal easy.

Figure 1F:
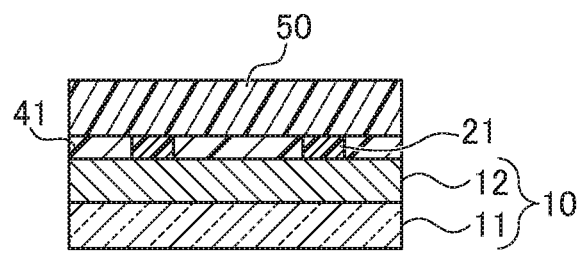
FIG. 1F is a view describing a step of the pattern formation method according to this embodiment.

Next, as illustrated in FIG. 1F, a layer 50 including the block copolymer is formed on the antireflection layer pattern 21 and the neutral pattern 41.

The block copolymer is not particularly limited as long as the block copolymer can form a lamellar structure by microphase separation. The block copolymer may be composed of two kinds of polymer chains or may be composed of three or more kinds of polymer chains, and is preferably a diblock copolymer composed of two kinds of polymer chains. In the diblock copolymer, a volume fraction rate of each polymer chain is approximately 50%.

Examples of a preferred diblock copolymer include a block copolymer composed of polystyrene chains and polymethyl methacrylate chains, a block copolymer composed of polystyrene chains and polyethyl methacrylate chains, a block copolymer composed of polystyrene chains and poly-t-butyl methacrylate chains, a block copolymer composed of polystyrene chains and polymethyl acrylate chains, a block copolymer composed of polystyrene chains and polyethyl acrylate chains, a block copolymer composed of polystyrene chains and poly t-butyl acrylate chains, a block copolymer composed of polystyrene chains and polybutadiene chains, a block copolymer composed of polystyrene chains and polyisoprene chains, and the like. Among these, a block copolymer (PS-b-PMMA) composed of polystyrene (PS) chains and polymethyl methacrylate (PMMA) chains is preferable.

A number-average molecular weight of the block copolymer is appropriately selected in correspondence with a pitch in a final fine pattern. For example, to obtain a fine pattern having a pitch of approximately 50 nm, it is preferable to use a block copolymer having the number-average molecular weight of approximately 80000 to 120000.

A formation method of the layer 50 including the block copolymer is not particularly limited. For example, a composition obtained by dissolving a block copolymer in an organic solvent is applied on the antireflection layer pattern 21 and the neutral pattern 41, and is dried to form the layer 50 including the block copolymer.

It is preferable to adjust a film thickness of the layer 50 including the block copolymer to be equal to or less than a pitch in a final fine pattern. For example, to obtain a fine pattern having a pitch of approximately 50 nm, it is preferable to adjust the film thickness of the layer 50 including the block copolymer to approximately 5 nm to 50 nm. The film thickness of the layer 50 including the block copolymer can be measured by the above-described electron microscope method.

Figure 1G:
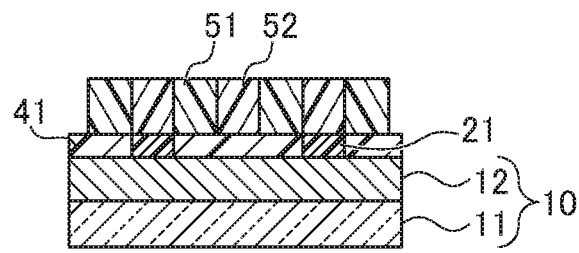
FIG. 1G is a view describing a step of the pattern formation method according to this embodiment.

Next, as illustrated in FIG. 1G, the layer 50 including the block copolymer is heat-treated, and a lamellar structure in which lamellar boundaries are oriented in a direction perpendicular to the base material 10 is formed by microphase separation of the block copolymer. Specifically, the layer 50 including the block copolymer is phase-separated into a first phase 51 corresponding to a part of block chain of the block copolymer and a second phase 52 corresponding to remaining block chains.

A heat treatment condition is not particularly limited as long as the block copolymer is phase-separated and a lamellar structure is formed under the condition. Examples of the condition include a condition in which the heat treatment is performed in vacuo at 200° C. to 250° C. for approximately 12 hours to 48 hours, and a condition in which the heat treatment is performed in the atmosphere at 250° C. to 300° C. for 1 minute to 15 minutes.

Figure 1H:
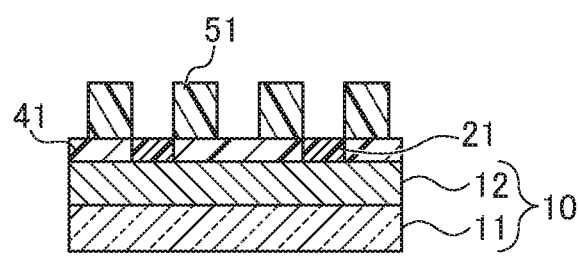
FIG. 1H is a view describing a step of the pattern formation method according to this embodiment.

Next, as illustrated in FIG. 1H, a part of block chain of the block copolymer is selectively removed to form a line-and-space-shaped fine pattern having a smaller pitch than the antireflection layer pattern 21. In FIG. 1H, as an example, a case where the second phase 52 compatible with the antireflection layer pattern 21 is selectively removed to form a fine pattern constituted by the first phase 51 is illustrated.

A method for selectively removing a part of block chain of the block copolymer is not particularly limited, and can be appropriately selected in correspondence with the kind of the block copolymer. For example, in the case of using a block copolymer (PS-b-PMMA) composed of polystyrene chains and polymethyl methacrylate chains, the polymethyl methacrylate chains are selectively removed by $O_2$ etching or the like to obtain a fine pattern constituted by the polystyrene chains. Note that, a rinse treatment with water or the like may be performed after etching.

Figure 1I:
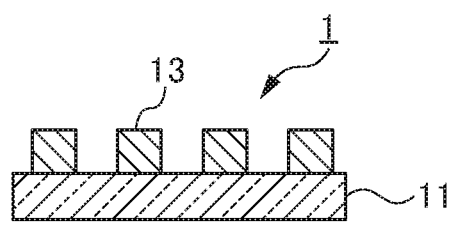
FIG. 1I is a view describing a step of the pattern formation method according to this embodiment.

The fine pattern constituted by the first phase 51 formed as described above can be used as a mask when etching the metal film 12. For example, as illustrated in FIG. 1I, the metal film 12 is etched by using the fine pattern constituted by the first phase 51 as a mask to form a wire 13 extending in one direction, and then the antireflection layer pattern 21, the neutral pattern 41, and the fine pattern constituted by the first phase 51 are removed to obtain the polarizing plate 1.

[Method for Manufacturing Polarizing Plate]

A method for manufacturing a polarizing plate according to this embodiment includes a step of forming a fine pattern by the pattern formation method according to this embodiment on a base material in which a metal film or a laminated film including a metal film is formed on a transparent substrate, and a step of etching the metal film or the laminated film by using the fine pattern as a mask.

The base material may be a base material in which a metal film is formed on a transparent substrate, or a base material in which a laminated film including a metal film is formed on the transparent substrate. Examples of the base material in which the metal film is formed on the transparent substrate include a base material in which a metal film formed from Al or the like is formed on a transparent substrate such as a glass substrate. In addition, examples of the base material in which the laminated film including a metal film is formed on the transparent substrate include a base material in which a metal film formed from Al, a dielectric film formed from an Si oxide or the like, and an absorption film formed from an FeSi alloy or the like are laminated in this order on a transparent substrate such as a glass substrate.

In the case of using the base material in which the metal film is formed on the transparent substrate, for example, a polarizing plate can be manufactured as illustrated in FIGS. 1A to 1I. That is, after forming a fine pattern constituted by the first phase 51 on the base material 10, the metal film 12 is etched by using the fine pattern as a mask, and the wire 13 extending in one direction is formed, thereby obtaining the polarizing plate 1.

Even in the case of using the base material in which the laminated film including the metal film is formed on the transparent substrate, similarly, after forming a fine pattern, the laminated film is etched by using the fine pattern as a mask, and a lattice-shaped block portion extending in one direction is formed, thereby obtaining a polarizing plate.

Modification Example

Note that, the invention is not limited to the above-described embodiment, and a modification and an improvement capable of accomplishing the object of the invention are included in the invention.

In the above-described embodiment, in the case of using the block copolymer (PS-b-PMMA) composed of polystyrene chains and polymethyl methacrylate chains, description has been given of an example in which the polymethyl methacrylate chains are selectively removed to obtain a fine pattern constituted by the polystyrene chains, but the polystyrene chains may be selectively removed without limitation to the example.

For example, there is known that polymer chains including a carbonyl group as in the polymethyl methacrylate chains are reacted with a metal oxide precursor such as titanium chloride ($TiCl_4$), aluminum chloride ($AlCl_3$), and trimethyl aluminum ($Al(CH_3)_3$), and are oxidized by using water vapor into a metal oxide. For example, when the polymethyl methacrylate chains are reacted with trimethyl aluminum and are oxidized by using water vapor, it is possible to convert polymethyl methacrylate into aluminum oxide ($Al_2O_3$). Here, when selectively removing the polystyrene chains after the polymethyl methacrylate chains are made into a metal oxide, it is possible to form a fine pattern constituted by the metal oxide. There is a tendency that the fine pattern constituted by the metal oxide has etching resistance superior to that of the fine pattern constituted by the polystyrene chains or the like.

In addition, in the embodiment, description has been given of an example in which the antireflection layer 20 is etching by using the photoresist pattern 31 as a mask, and the antireflection layer pattern 21 that is obtained is used as the guide pattern, but there is no limitation to the example. For example, after forming a layer formed from a material compatible with a part of block chain of the block copolymer on the base material 10, and the layer may be patterned by a nanoimprint method, and an obtained pattern may be used as the guide pattern.

EXPLANATION OF REFERENCE NUMERALS

1 POLARIZING PLATE
10 BASE MATERIAL
11 TRANSPARENT SUBSTRATE
12 METAL FILM
13 WIRE
20 ANTIREFLECTION LAYER
21 ANTIREFLECTION LAYER PATTERN (GUIDE PATTERN)
30 PHOTORESIST LAYER
31 PHOTORESIST PATTERN
40 NEUTRAL LAYER
41 NEUTRAL PATTERN
50 LAYER INCLUDING BLOCK COPOLYMER
51 FIRST PHASE
52 SECOND PHASE

The invention claimed is:

1. A pattern formation method using a block copolymer capable of forming a lamellar structure by microphase separation, the pattern formation method comprising:
    a step of forming a linear guide pattern that is compatible with a part of a plurality of block chains of the block copolymer and is arranged at a predetermined pitch, and a neutral pattern embedded between a plurality of the guide patterns on a base material in which a metal film or a laminated film including a metal film is formed on a transparent substrate,
    wherein the neutral pattern is compatible with each block chain of the plurality of block chains of the block copolymer;
    a step of forming a layer including the block copolymer on the guide pattern and the neutral pattern;
    a step of heat-treating the layer including the block copolymer and forming the lamellar structure in which a lamellar boundary is arranged perpendicular to the base material by microphase separation of the block copolymer; and
    a step of forming a line-and-space-shaped fine pattern having a smaller pitch than the guide pattern by selectively removing a part of the block chains of the block copolymer,
    wherein the step of forming the guide pattern and the neutral pattern on the base material includes:
        a step of laminating an antireflection layer and a photoresist layer on the base material in this order,
        a step of exposing and developing the photoresist layer and forming a line-and-space-shaped photoresist pattern,
        a step of etching the antireflection layer by using the photoresist pattern as a mask and forming a line-and-space-shaped antireflection layer pattern,
        a step of covering the photoresist pattern and the antireflection layer pattern with a neutral layer, and
        a step of removing the photoresist pattern in combination with a part of the neutral layer, and
        the antireflection layer pattern is set as the guide pattern, and a pattern constituted by the remainder of the neutral layer is set as the neutral pattern.

2. The pattern formation method according to claim 1, wherein exposure of the photoresist layer is performed by interference exposure.

3. The pattern formation method according to claim 1, wherein a film thickness of the guide pattern is greater than a film thickness of the neutral pattern.

4. The pattern formation method according to claim 1, wherein the block copolymer is composed of polystyrene chains and polymethyl methacrylate chains.

5. The pattern formation method according to claim 4, wherein in the step of forming the fine pattern, a fine pattern constituted by the polystyrene chains is formed by selectively removing the polymethyl methacrylate chains of the block copolymer.

6. The pattern formation method according to claim 4, further comprising:
    a step of making the polymethyl methacrylate chains of the block copolymer into a metal oxide by way of treatment with a metal oxide precursor and subsequent treatment with water vapor, the step being performed after the heat treatment of the layer including the block copolymer, wherein in the step of forming the fine pattern, a fine pattern constituted by a metal oxide is formed by selectively removing the polystyrene chains of the block copolymer.

7. A method for manufacturing a polarizing plate, comprising:
   a step of forming a fine pattern by the pattern formation method according to claim 1 on a base material in which a metal film or a laminated film including a metal film is formed on a transparent substrate; and
   a step of etching the metal film or the laminated film by using the fine pattern as a mask.

8. The pattern formation method according to claim 1, wherein the laminated film is a laminated film in which a metal film, a dielectric film, and an absorption film are laminated in this order from the transparent substrate side.

* * * * *